United States Patent
Tran et al.

(10) Patent No.: US 10,325,666 B2
(45) Date of Patent: Jun. 18, 2019

(54) FLASH MEMORY SYSTEM USING NEGATIVE HIGH VOLTAGE LEVEL SHIFTER

(71) Applicant: Silicon Storage Technology, Inc., San Jose, CA (US)

(72) Inventors: Hieu Van Tran, San Jose, CA (US); Anh Ly, San Jose, CA (US); Thuan Vu, San Jose, CA (US); Hung Quoc Nguyen, Fremont, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 16/218,398

(22) Filed: Dec. 12, 2018

(65) Prior Publication Data

US 2019/0115088 A1    Apr. 18, 2019

Related U.S. Application Data

(62) Division of application No. 15/361,473, filed on Nov. 27, 2016, now Pat. No. 10,186,322, which is a
(Continued)

(51) Int. Cl.
| | | |
|---|---|---|
| G11C 7/00 | (2006.01) |
| G11C 16/30 | (2006.01) |
| G11C 16/08 | (2006.01) |
| G11C 16/04 | (2006.01) |
| G11C 16/14 | (2006.01) |
| H01L 27/11521 | (2017.01) |
| G11C 16/26 | (2006.01) |
| G11C 5/14 | (2006.01) |
| G11C 16/10 | (2006.01) |

(Continued)

(52) U.S. Cl.
CPC ............. *G11C 16/30* (2013.01); *G11C 5/14* (2013.01); *G11C 5/145* (2013.01); *G11C 5/147* (2013.01); *G11C 8/08* (2013.01); *G11C 16/0408* (2013.01); *G11C 16/0425* (2013.01); *G11C 16/08* (2013.01); *G11C 16/10* (2013.01); *G11C 16/14* (2013.01); *G11C 16/16* (2013.01); *G11C 16/26* (2013.01); *H01L 27/11521* (2013.01); *G11C 2216/04* (2013.01)

(58) Field of Classification Search
CPC .......... G11C 16/30; G11C 16/12; G11C 8/08; G11C 5/147
See application file for complete search history.

(56) References Cited

U.S. PATENT DOCUMENTS

| | | |
|---|---|---|
| 5,331,188 A | 7/1994 | Acovic |
| 5,576,570 A | 11/1996 | Ohsawa |

(Continued)

FOREIGN PATENT DOCUMENTS

| | | |
|---|---|---|
| JP | H11-232888 A | 8/1999 |
| JP | 2010-257559 A | 11/2010 |

*Primary Examiner* — Tuan T Nguyen
(74) *Attorney, Agent, or Firm* — DLA Piper LLP US

(57) ABSTRACT

During a program, read, or erase operation of one or more non-volatile flash memory cells in an array of non-volatile flash memory cells, a negative voltage can be applied to the word lines and/or coupling gates of the selected or unselected non-volatile flash memory cells. The negative voltage is generated by a negative high voltage level shifter using one of several embodiments disclosed herein.

16 Claims, 25 Drawing Sheets

Related U.S. Application Data division of application No. 15/135,346, filed on Apr. 21, 2016, now Pat. No. 9,508,443, which is a division of application No. 14/602,262, filed on Jan. 21, 2015, now Pat. No. 9,361,995.

(51) Int. Cl.
*G11C 8/08* (2006.01)
*G11C 16/16* (2006.01)

(56) References Cited

U.S. PATENT DOCUMENTS

| | | | |
|---|---|---|---|
| 6,005,810 | A | 12/1999 | Wu |
| 6,493,262 | B1 | 12/2002 | Wald et al. |
| 6,757,196 | B1 | 6/2004 | Tsao |
| 6,798,008 | B2 | 9/2004 | Choi |
| 6,979,856 | B2 | 12/2005 | Nishizaka |
| 7,030,699 | B2 | 4/2006 | Richard |
| 7,031,192 | B1 | 4/2006 | Park |
| 7,868,375 | B2 | 1/2011 | Liu et al. |
| 8,106,701 | B1 | 1/2012 | Huynh et al. |
| 8,391,078 | B2 | 3/2013 | Leung |
| 8,619,469 | B2 | 12/2013 | Pasotti |
| 2002/0141249 | A1 | 10/2002 | Tedrow et al. |
| 2003/0022441 | A1 | 1/2003 | Ogura |
| 2004/0071011 | A1 | 4/2004 | Nishizaka |
| 2006/0197386 | A1* | 9/2006 | Chu .............. G11C 16/30 307/112 |
| 2006/0245254 | A1 | 11/2006 | Ishii |
| 2008/0285359 | A1* | 11/2008 | De Sandre .......... G11C 7/1051 365/189.11 |
| 2010/0046290 | A1 | 2/2010 | Park |
| 2010/0080040 | A1 | 4/2010 | Choi |
| 2010/0157670 | A1 | 6/2010 | Chevallier et al. |
| 2012/0063233 | A1 | 3/2012 | Lee |
| 2013/0010539 | A1 | 1/2013 | Shim et al. |
| 2013/0128667 | A1 | 5/2013 | Lee |
| 2013/0141978 | A1 | 6/2013 | Hirose |
| 2013/0182509 | A1 | 7/2013 | Lee |
| 2013/0242672 | A1 | 9/2013 | Tran |
| 2014/0269049 | A1 | 9/2014 | Tran |
| 2014/0369136 | A1 | 12/2014 | Hirose et al. |
| 2015/0078086 | A1 | 3/2015 | Lee |
| 2015/0155039 | A1 | 6/2015 | Tran |
| 2016/0042790 | A1 | 2/2016 | Tran |

* cited by examiner

Negative High Voltage Discharge Circuit
1300

FIGURE 14  Negative High Voltage Discharge Circuit 1400

Erase Gate Decoder Circuit
1800

Source Line Decoder Circuit
1900

Charge Pump 2000

Negative High Voltage Level Shifter
2100

2205

2210

2215

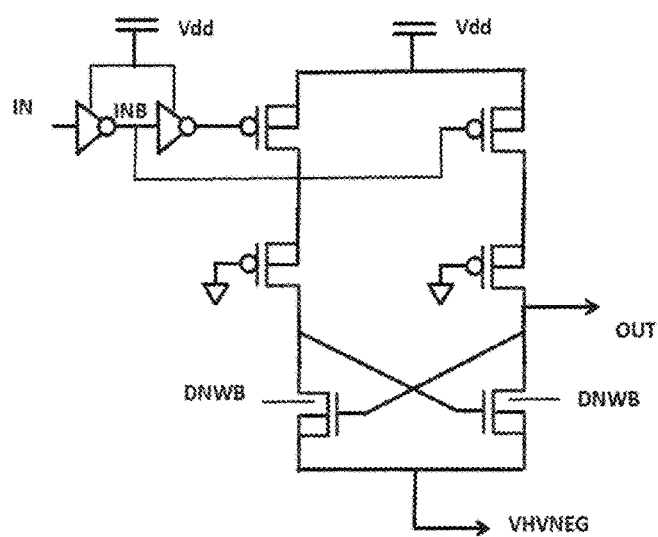
FIGURE 23  Negative High Voltage Level Shifter 2300

Multiplexor 2400

Negative High Voltage Level Shifter 2500

FLASH MEMORY SYSTEM USING NEGATIVE HIGH VOLTAGE LEVEL SHIFTER

PRIORITY CLAIM

This application is a divisional of U.S. application Ser. No. 15/361,473, filed on Nov. 27, 2016, and titled "Flash Memory System Using Complementary Voltage Supplies," which is a divisional of U.S. application Ser. No. 15/135,346, now U.S. Pat. No. 9,508,443, filed on Apr. 21, 2016, and titled "Flash Memory System Using Complementary Voltage," which is a divisional of U.S. application Ser. No. 14/602,262, now U.S. Pat. No. 9,361,995, filed on Jan. 21, 2015, and titled "Flash Memory System Using Complementary Voltage," each of which is incorporated herein by reference.

TECHNICAL FIELD

The present invention relates to a non-volatile memory cell device and a method of operating same. More particularly, the present invention relates to such memory device in which complementary voltage supplies are used. A negative voltage is applied to the control gate and/or word line or a selected or unselected memory cell during the operations of read, program or erase.

BACKGROUND OF THE INVENTION

Non-volatile memory cells are well known in the art. One prior art non-volatile split gate memory cell 10 is shown in FIG. 1. The memory cell 10 comprises a semiconductor substrate 12 of a first conductivity type, such as P type. The substrate 12 has a surface on which there is formed a first region 14 (also known as the source line SL) of a second conductivity type, such as N type. A second region 16 (also known as the drain line) also of N type is formed on the surface of the substrate 12. Between the first region 14 and the second region 16 is a channel region 18. A bit line BL 20 is connected to the second region 16. A word line WL 22 is positioned above a first portion of the channel region 18 and is insulated therefrom. The word line 22 has little or no overlap with the second region 16. A floating gate FG 24 is over another portion of the channel region 18. The floating gate 24 is insulated therefrom, and is adjacent to the word line 22. The floating gate 24 is also adjacent to the first region 14. The floating gate 24 may overlap the first region 14 to provide coupling from the region 14 into the floating gate 24. A coupling gate CG (also known as control gate) 26 is over the floating gate 24 and is insulated therefrom. An erase gate EG 28 is over the first region 14 and is adjacent to the floating gate 24 and the coupling gate 26 and is insulated therefrom. The top corner of the floating gate 24 may point toward the inside corner of the T-shaped erase gate 28 to enhance erase efficiency. The erase gate 28 is also insulated from the first region 14. The cell 10 is more particularly described in U.S. Pat. No. 7,868,375 whose disclosure is incorporated herein by reference in its entirety.

One exemplary operation for erase and program of prior art non-volatile memory cell 10 is as follows. The cell 10 is erased, through a Fowler-Nordheim tunneling mechanism, by applying a high voltage on the erase gate 28 with other terminals equal to zero volt. Electrons tunnel from the floating gate 24 into the erase gate 28 causing the floating gate 24 to be positively charged, turning on the cell 10 in a read condition. The resulting cell erased state is known as '1' state. The cell 10 is programmed, through a source side hot electron programming mechanism, by applying a high voltage on the coupling gate 26, a high voltage on the source line 14, a medium voltage on the erase gate 28, and a programming current on the bit line 20. A portion of electrons flowing across the gap between the word line 22 and the floating gate 24 acquire enough energy to inject into the floating gate 24 causing the floating gate 24 to be negatively charged, turning off the cell 10 in read condition. The resulting cell programmed state is known as '0' state.

In the prior art, various combinations of positive or zero voltages were applied to word line 22, coupling gate 26, and floating gate 24 to perform read, program, and erase operations. The prior art did not apply negative voltages for these operations.

One object of the present invention is to utilize negative and positive voltages for a non-volatile memory cell device such that a negative voltage is applied to word line 22 and/or coupling gate 26 during read, program, and/or erase operations for selected or unselected cells, depending on the operation. This will allow for the use of a lower positive voltage supply than in the prior art, which will allow for a more compact and space-efficient layout for the memory cell device.

SUMMARY OF THE INVENTION

The present invention utilizes negative and positive voltages for a non-volatile memory cell device such that a negative voltage is applied to word line 22 and/or coupling gate 26 during read, program, and/or erase operations for selected or unselected cells, depending on the operation. As a result, the present invention allows for a more compact and space-efficient layout for the memory cell device than the prior art.

BRIEF DESCRIPTION OF THE DRAWINGS

FIG. 23 depicts another negative high voltage level shifter.

DETAILED DESCRIPTION OF THE PREFERRED EMBODIMENT

Figure 1:
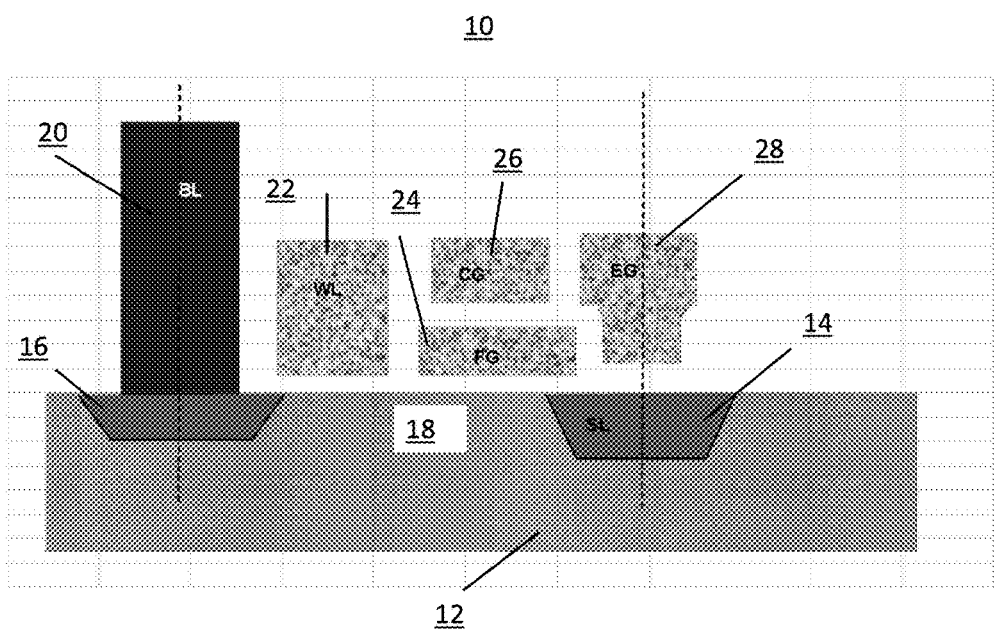
FIG. 1 is a cross-sectional view of a non-volatile memory cell of the prior art to which the method of the present invention can be applied.
Figure 2:
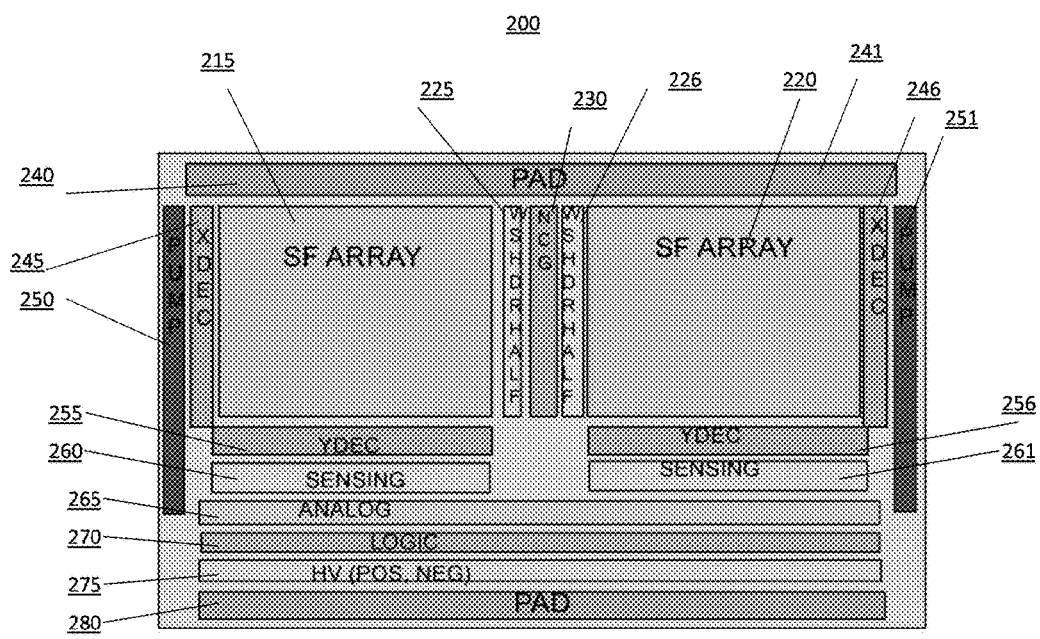
FIG. 2 is a block diagram of a non-volatile memory device using the non-volatile memory cell of the prior art shown in FIG. 1.

FIG. 2 depicts an embodiment of an architecture for a flash memory system comprising die 200. Die 200 comprises: memory array 215 and memory array 220 for storing data, memory arrays 215 and 220 comprising rows and columns of memory cells of the type described previously as memory cell 10 in FIG. 1, pad 240 and pad 280 for enabling electrical communication between the other components of die 200 and, typically, wire bonds (not shown) that in turn connect to pins (not shown) or package bumps that are used to access the integrated circuit from outside of the packaged chip or macro interface pins (not shown) for interconnecting to other macros on a SOC (system on chip); high voltage circuit 275 used to provide positive and negative voltage supplies for the system; control logic 270 for providing various control functions, such as redundancy and built-in self-testing; analog circuit 265; sensing circuits 260 and 261 used to read data from memory array 215 and memory array 220, respectively; row decoder circuit 245 and row decoder circuit 246 used to access the row in memory array 215 and memory array 220, respectively, to be read from or written to; column decoder circuit 255 and column decoder circuit 256 used to access bytes in memory array 215 and memory array 220, respectively, to be read from or written to; charge pump circuit 250 and charge pump circuit 251, used to provide increased voltages for program and erase operations for memory array 215 and memory array 220, respectively; negative voltage driver circuit 230 shared by memory array 215 and memory array 220 for read and write operations; high voltage driver circuit 225 used by memory array 215 during read and write operations and high voltage driver circuit 226 used by memory array 220 during read and write operations.

In response to the read, erase or program command, the logic circuit 270 causes the various voltages to be supplied in a timely and least disturb manner to the various portions of both the selected memory cell 10 and the unselected memory cells 10.

For the selected and unselected memory cell 10, the voltage and current applied are as follows. As used hereinafter, the following abbreviations are used: source line or first region 14 (SL), bit line 20 (BL), word line 22 (WL), and coupling gate 26 (CG).

The prior art method of performing read, erase, and program operations for selected memory cell 10 or unselected memory cell 10 involves applying the following voltages:

Operation #1: PEO (positive erase operation) table

|  | WL | WL-unsel | BL | BL-unsel | CG | CG-unsel same sector | CG-unsel | EG | EG-unsel |
|---|---|---|---|---|---|---|---|---|---|
| Read | 1.0-2 V | 0 V | 0.6-2 V | 0 V | 0-2.6 V | 0-2.6 V | 0-2.6 V | 0-2.6 V | 0-2.6 V |
| Erase | 0 V | 0 V | 0 V | 0 V | 0 V | 0-2.6 V | 0-2.6 V | 11.5-12 V | 0-2.6 V |
| Program | 1 V | 0 V | 1uA | Vinh | 10-11 V | 0-2.6 V | 0-2.6 V | 4.5-5 V | 0-2.6 V |

|  | SL | SL-unsel |
|---|---|---|
| Read | 0 V | 0 V |
| Erase | 0 V | 0 V |
| Program | 4.5-5 V | 0-1 V |

In one embodiment, negative voltages can be applied to word line 22 when memory cell 10 is unselected during read and program operations, such that the following voltages are applied:

Operation #2: PEO (positive erase operation) table

|  | WL | WL-unsel | BL | BL-unsel | CG | CG-unsel same sector | CG-unsel | EG | EG-unsel |
|---|---|---|---|---|---|---|---|---|---|
| Read | 1.0-2 V | −0.5 V/0 V | 0.6-2 V | 0 V | 0-2.6 V | 0-2.6 V | 0-2.6 V | 0-2.6 V | 0-2.6 V |
| Erase | 0 V | 0 V | 0 V | 0 V | 0 V | 0-2.6 V | 0-2.6 V | 11.5-12 V | 0-2.6 V |
| Program | 1 V | −0.5 V/0 V | 1uA | Vinh | 10-11 V | 0-2.6 V | 0-2.6 V | 4.5-5 V | 0-2.6 V |

|  | SL | SL-unsel |
|---|---|---|
| Read | 0 V | 0 V |
| Erase | 0 V | 0 V |
| Program | 4.5-5 V | 0-1 V |

In another embodiment, negative voltages can be applied to word line 22 when memory cell 10 is unselected during read, erase, and program operations, and negative voltages can be applied to coupling gate 26 during an erase operation, such that the following voltages are applied:

Operation #3: PNEO (positive negative erase operation) table

|  | WL | WL-unsel | BL | BL-unsel | CG | CG-unsel same sector | CG-unsel | EG | EG-unsel |
|---|---|---|---|---|---|---|---|---|---|
| Read | 1.0-2 V | −0.5 V/0 V | 0.6-2 V | 0-FloatV | 0-2.6 V | 0-2.6 V | 0-2.6 V | 0-2.6 V | 0-2.6 V |
| Erase | 0 V | −0.5 V/0 V | 0 V | 0-FloatV | −(5-9) V | 0-2.6 V | 0-2.6 V | 8-9 V | 0-2.6 V |
| Program | 1 V | −0.5 V/0 V | 0.1-1uA | Vinh | 8-9 V | CGINH (3-6 V) | 0-2.6 V | 6-9 V | 0-2.6 V |

|  | SL | SL-unsel |
|---|---|---|
| Read | 0 V | 0-0.5 V |
| Erase | 0 V | 0-1 V |
| Program | 4.5-5 V | 0-1 V |

The CGINH signal listed above is a inhibit signal that is applied to the coupling gate 26 of an unselected cell that shares an erase gate 28 with a selected cell.

Figure 3:
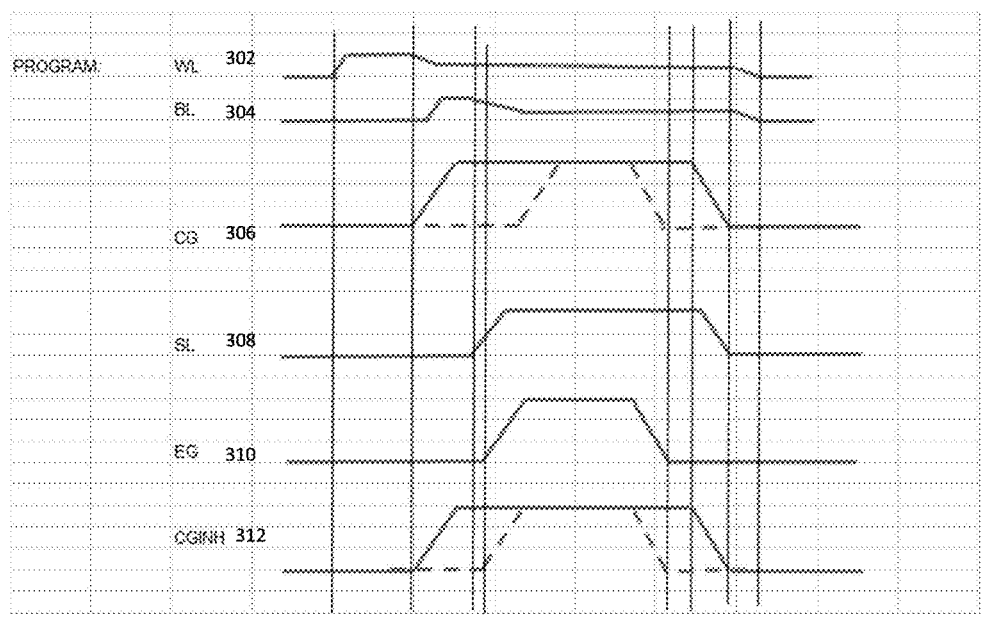
FIG. 3 depicts exemplary waveforms for a programming operation of a non-volatile memory device.

Referring to FIG. 3, there is shown one example of signal timing waveforms for a program operation under Operation #3 described above. Signals WL, BL, CG, SL, EG as corresponding respectively to terminals WL, BL, CG, SL, EG of the memory cell 10 are as described above. For programming, a signal WL 302 goes to high (e.g., ~Vdd) first (such as to set a control signal in decoder circuit 1600 described below then start to settle down (to a bias voltage Vpwl). Then signal BL 304 and CG 306 go high, e.g., ~Vinh=~Vdd and 10 to 11 v respectively, and then SL 308 goes high (e.g., ~4.5 v to 5 v). Alternatively, CG 306 goes high after SL 308 (as shown by the dotted line waveform). Signal CGINH 312 goes high, e.g., 3-6V, concurrently or at approximately the same time with the signal CG 306, and goes high preferably before signal EG 310 going high, e.g., 6-9V, to reduce the disturb effect on un-selected CG with CGINH level. Alternatively, the signal CGINH 312 can go high at approximately the same time the signal EG 310. The signal WL 302 settles down to a voltage Vpwl, e.g., 1 v, and the signal BL 304 settles down to a voltage Vdp, e.g., ~0.5 v as CG goes high. Unselected WLs goes down to 0V or negative, e.g., −0.5 v, before or concurrent with selected WL 302 goes high. Unselected CGs and EGs stays at value in standby, e.g., 0 to 2.6 v. Unselected SLs stays at a value in standby, e.g., 0 v or switches to a bias voltage, e.g., 1 v, as CG 306 goes high (unselected SL switching to a bias level to prevent leakage current through unselected cells through the BLs). The P substrate 12 is at zero volts or alternatively can be at a negative voltage level in programming.

The signal BL 304 goes first high to Vinh (inhibit voltage) to prevent inadvertent program disturb due various signals are not settled yet during ramping to programming voltages. The timed sequence CG 306 vs. SL 310 are optimized to reduce disturb effect, e.g. whichever signal causes more disturb goes high last. The ramping down of programming pulses are reversed in order to minimize disturb (i.e., signal that goes up first now goes down last). The signal SL 310 goes down, then CG 306 goes down, then WL 302 and BL 304 goes down. In the embodiment of programming with the substrate P going negative, e.g., −1V, this negative switching is concurrent with the signal WL goes low or the CG goes high. The timed sequence of EG 310 and CGINH 312 is optimized to reduce disturb effect (soft erase in shared EG unselected row) as shown. The signal CGINH 312 goes high before or approximately at the same time as the signal EG 312. The ramping down is reversed with CGINH 312 going down after or approximately at the same time as the signal EG 312.

Figure 4:
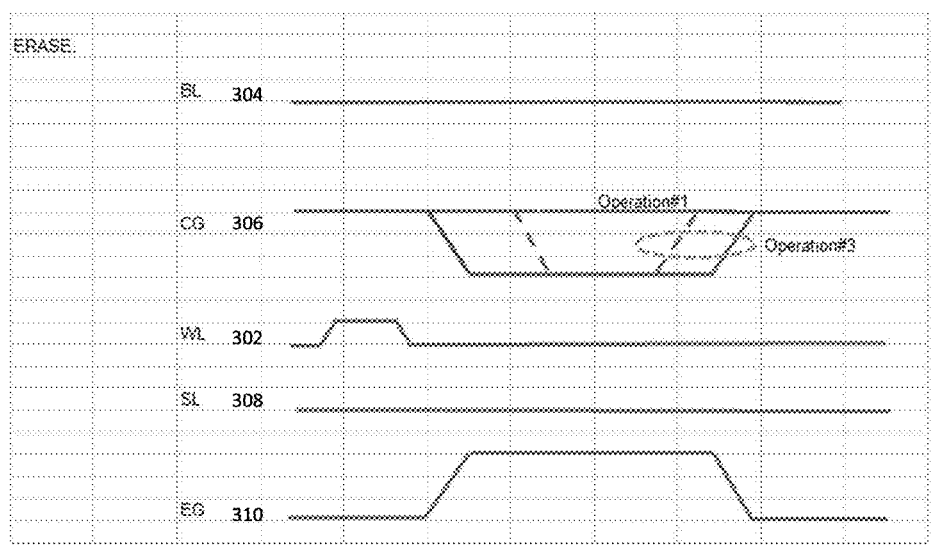
FIG. 4 depicts exemplary waveforms for an erase operation of a non-volatile memory device.

Referring to FIG. 4, there is shown one example of signal timing waveforms for an erase operation under Operation #3 described above. For erase, the signal WL 302 goes high, e.g., Vdd, (such as to set control signal in the decoder circuit 1600 described below) then goes low, e.g., 0V (or alternatively a negative such as −0.5V). At approximately same time or a short time thereafter as the WL 302 going low, the signal CG 306 goes negative, e.g., −6V to −9V. The selected EG 310 then goes high, e.g., 9V to 6V. The signals BL 304, SL 308 stays at a value in standby, e.g., 0V. Unselected WLs goes down to 0V or negative, e.g., −0.5V, before or concurrent with selected EG 310 going high. Unselected CGs and EGs stay at value in standby, e.g., 0 to 2.6V. Alternatively unselected CGs can be at a negative level (same as selected CG negative level). Unselected SLs stay at a value in standby, e.g., 0V. The P substrate 12 is at zero volt or alternatively can be at a negative voltage level to enhance the erasing.

The ramping down of erase pulses is approximately reversed in order (i.e., signal that goes up first now goes down last). The signals EG 310 and CG 306 goes to standby value, e.g., 0V.

Figure 5:
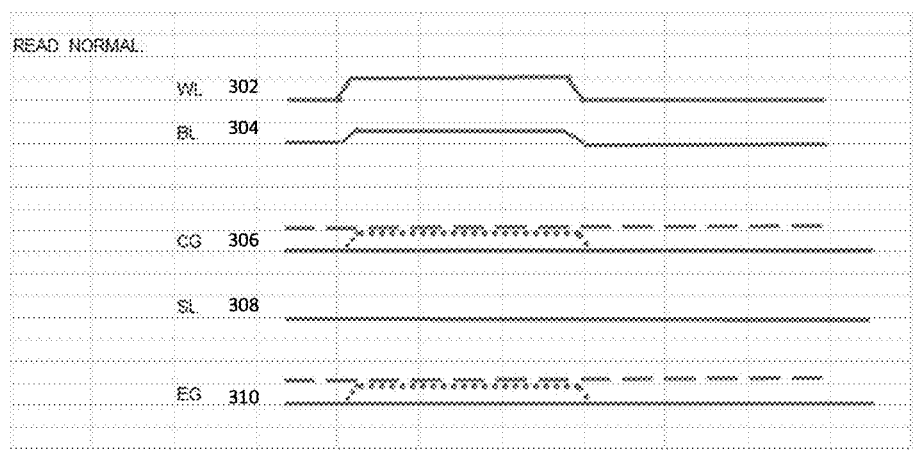
FIG. 5 depicts exemplary waveforms for a normal read operation of a non-volatile memory device.
Figure 6:
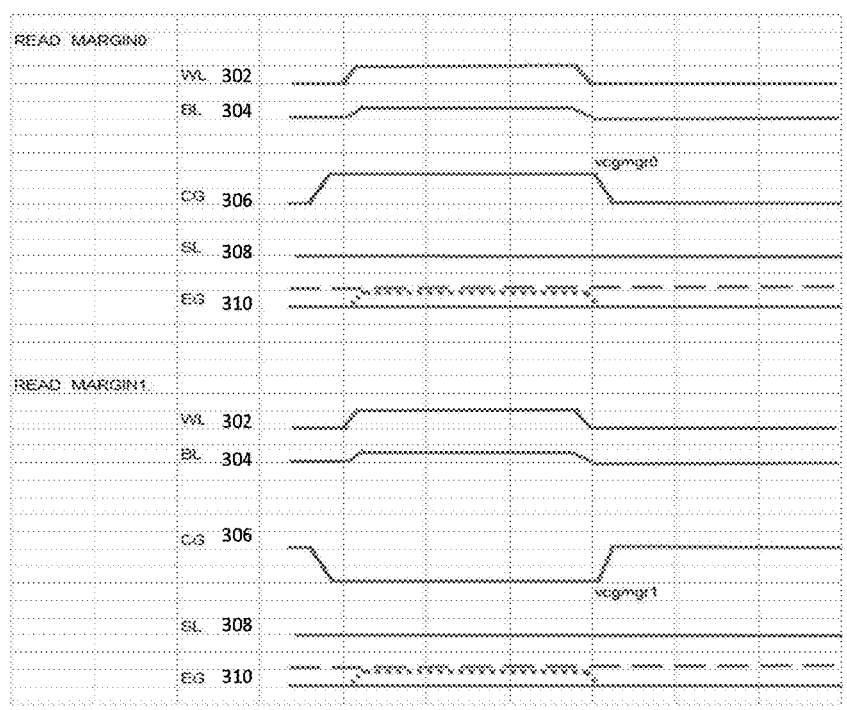
FIG. 6 depicts exemplary waveforms for a read operation of a non-volatile memory device using tolerance thresholds for reading a "0" and a "1."

Referring to FIG. 5, there is shown one example of signal timing waveforms for a read operation under Operation #3 described above. Referring to FIG. 6, there is shown one example of a signal timing waveform for read signals for positive/negative bias levels as described above for use in the memory device 10 of the present invention. This read signal waveform goes with the program and erase signal waveform in FIG. 3 for complete non-volatile erase/program/read operation. For Read Normal waveform, the SL 308 is at standby value, e.g., 0V. The CG 306 is at standby value, e.g., 0V or 2.6V, or alternatively switching to a higher bias value in read, e.g. 3.6V (to help increase the memory cell current due to CG voltage coupling to FG potential in read condition). The EG 310 is at standby value, e.g., 0V or 2.6V, or alternatively switching to a higher bias value in read, e.g. 3.6V (to help increase the memory cell current due to EG voltage coupling to FG potential in read condition). The standby values are similar to those for program and erase condition. The WL 302 and BL 304 switch to bias level in read, e.g. 2.6V and 1.0V respectively to selected memory cells for reading. Unselected WLs can be biased at zero volt or a negative voltage level, e.g., −0.5V (to reduce leakage on unselected rows). Unselected SLs can be biased at zero volt or a positive bias voltage level, e.g, 0.1-0.7V (to reduce leakage on unselected rows). Unselected BLs can be biased at zero volt or alternatively be floated, meaning no voltage applied (effectively reduce BL-BL capacitance in read).

With reference to FIG. 6, a Read Margin0 operation is performed after programming the whole array to detect weak programming cells. After programming, the cell current is at a very low value normally <nano amperes (nA), this corresponds to reading out a '0' digital value (no cell current). However some cells may marginally stay at a couple micro amperes (due to weak programming due to various reasons such as cell leakage, weak cell programming coupling ratio, process geometrical effect, etc. . . . ) and this can causing read '0' to fail during the operating lifetime of the memory device 10. A Read Margin0 is used to screen out those weak cells. For Read Margin0 waveform, the SL 308 is at standby value, e.g., 0 v. The WL 302 and BL 304 switch to bias level in read, e.g. 2.6 v and 1.0 v respectively to selected memory cells for reading as in Read Normal condition. The CG 306 is biased at a margin0 value in read, e.g. 3V, to detect weak programmed cells. The CG voltage will couple into FG potential to amplify the weak programming effect, effectively increase the cell current, so the weak cells now read as a '1' instead of a '0' (effectively there is cell current instead of no cell current).

A Read Margin1 operation is performed after erasing the whole array to detect weak erased cells. Negative CG now is utilized to detect this condition. The SL 308 is at standby value, e.g., 0 v. The WL 302 and BL 304 switch to bias level in read, e.g. 2.6 v and 1.0 v respectively to selected memory cells for reading as in Read Normal condition. The CG 306 is biased at a margin1 value in read, e.g. −3 v to −5 v, to detect weak erased cells. The CG voltage will couple negatively into FG potential to amplify the weak erased effect, effectively decrease the cell current (less FG potential), so the weak erased cells now read as a '0' instead of a '1' (effectively there is no cell current instead of cell current).

Figure 7A:
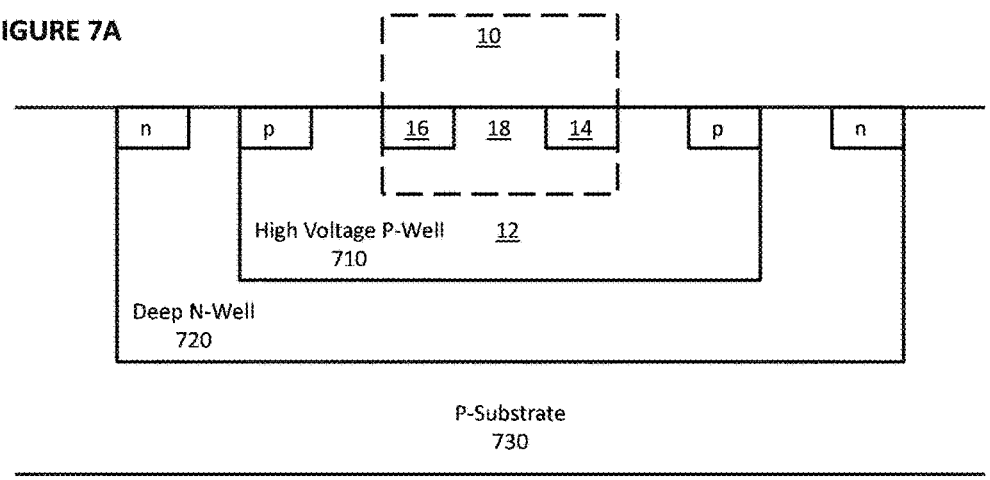
FIG. 7A depicts a cross-section of a non-volatile memory cell.

Referring to FIG. 7A, an embodiment of a device cross section for memory cell 10 is depicted. Alternative embodiment of a device cross section for memory cell 10 is in P-substrate 730 without High Voltage P-well 710 and Deep N-well 720. The memory cell 10 with source region 14, bitline region 16, channel region 18, and substrate region 12 is shown sitting inside region High Voltage (HV) P-well 710 (other regions or terminals of the memory cell 10 is not shown). The region P-well 710 sits inside a Deep N-well (DNW) region 720. The Deep N-well region 720 sits inside a P-substrate 730. Due to isolation feature of the DNW region 720, typically connected to zero volt or Vdd, the HV P-well 710 can be biased negative to enhance electrical performance of the memory cells such as in erase or program.

Figure 7B:
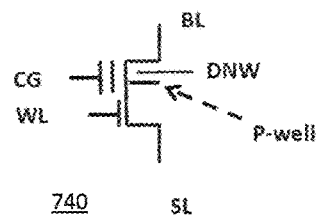
FIG. 7B depicts a symbolic representation of the memory cell of FIG. 7A.
Figure 7C:
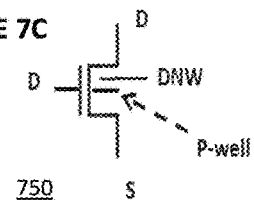
FIG. 7C depicts a symbolic representation of the memory cell of FIG. 7A.

The device cross section in FIG. 7 also is applicable for a high voltage nmos transistor in Deep N-well with high voltage nmos source, drain, and channel replacing respectively region 16, 14, 18 of the memory cell 10. Deep N-well 720 similarly serves as a voltage isolation region such that the high voltage nmos can be applied in negative voltage operation. Embodiments are done to ensure reduced stress across transistor terminals and junctions of the HV nmos in DNW.

Referring to FIG. 7B, a symbolic representation 740 of memory cell 10 is depicted, with deep N-well 720 shown as "DNW" and HV P-well 710 shown as P-well." Shown in FIG. 7B is a transistor symbol 750 for NMOS in HV P-well 710 inside Deep N-well 720.

Figure 8:
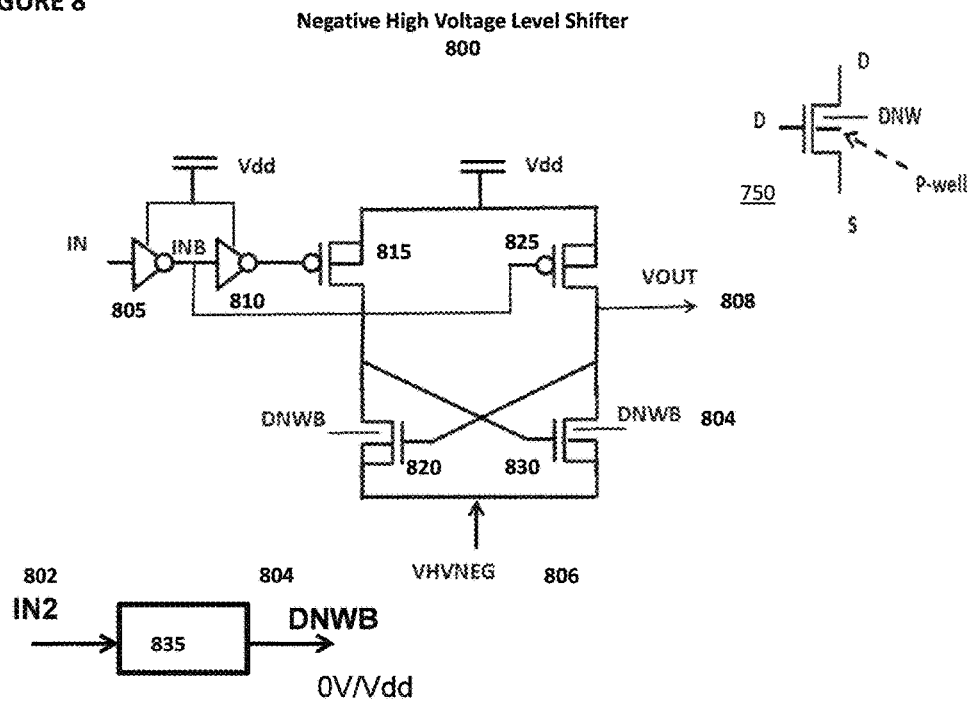
FIG. 8 depicts a negative high voltage level shifter.

Referring to FIG. 8, a first embodiment of a level shifter is depicted, negative high voltage level shifter 800, which can be contained in logic 270, negative voltage driver circuit 230, high voltage driver circuit 225, and/or high voltage driver circuit 226 in FIG. 2.

Negative high voltage level shifter 800 receives an input, IN, and produces an output, VNBN. Negative high voltage level shifter 800 drives the deep N-well DNWB 804 of transistor 820 and transistor 830 to minimize the occurrence of a breakdown between layers of transistor 820 and transistor 830. DNW control circuit 835 receives input IN2 802 to produce output DNWB 804 level as appropriate to reduce voltage stress for the transistors 820 and 830. Inverter 805 receives an input, IN, and produces an inverter output, INB, which is input into inverter 810 and the gate of PMOS transistor 825. The output of inverter 810 is coupled to the gate of PMOS transistor 815. PMOS transistors 815 and 825 are coupled to NMOS transistors 820 and 830 as shown. The output, VOUT 808, can vary between VHVNEG 806 and Vdd, which in this example are −8V and 2V, respectively. The DNWB level for example can be from 0V to Vdd (e.g., 2.5V) and it is 0V when VHVNEG is −8V. This minimizes the voltage stress to 8V (instead of 8V+2.5V=10.5V) between DNWB and HV P-well and source/drain of the transistors 820 and 830. Alternatively the DNWB level can be driven to −0.5V (without forward the P substrate—DNW junction) when VHVNEG is −8V to further minimize the voltage stress. At other times such as when VHVNEG is at zero volt or at a small negative voltage, the DNW control circuit 835 can drive DNWB to be positive, e.g., Vdd level, to minimize noise or latch-up (preventing forwarding P substrate to Deep Nwell junction). This technique for driving DNWB is applicable for all of the embodiments to be described.

Figure 9:
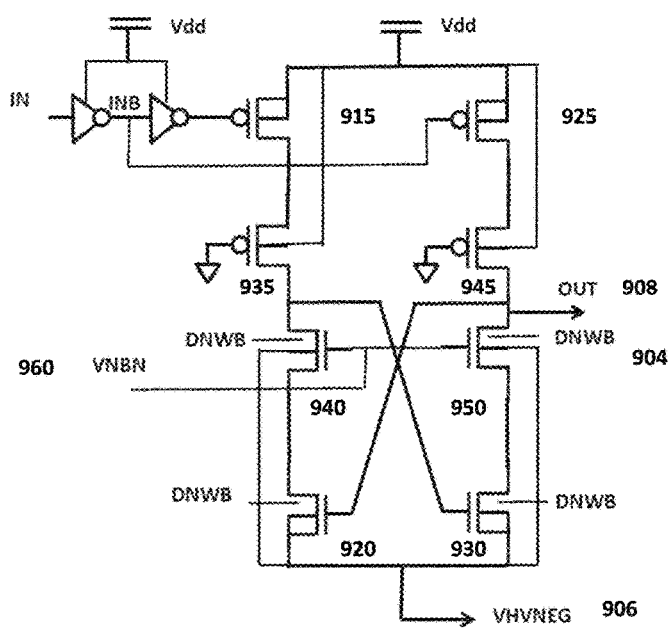
FIG. 9 depicts another negative high voltage level shifter.

Referring to FIG. 9, a second embodiment of a level shifter is depicted, negative high voltage level shifter 900, which can be contained in logic 270, negative voltage driver circuit 230, high voltage driver circuit 225, and/or high voltage driver circuit 226 in FIG. 2. Negative high voltage level shifter 900 comprises the same components as negative high voltage level shifter 800 with the addition of cascoding PMOS transistors 935 and 945 and cascoding NMOS transistors 940, and 950 as shown. Negative high voltage level shifter 900 receives an input, IN, and generates an output, OUT 908. The output, OUT 908, varies between VHVNEG 906 and Vdd, which in this example are −8V and 2V, respectively. The DNWB signal 904 is driven similarly to that of the negative high voltage level shifter circuit 800 to minimize voltage stress. The gates of the PMOS transistors 935 and 945 is connected to gnd (=0V instead of =Vdd) to minimize voltage stress across the gate-source/drain terminals. The gates of the NMOS transistors 940 and 950 is connected to VNBN 960 (=between Vdd and an intermediate negative level, e.g., −3V) to minimize voltage stress across the gate-source/drain (e.g., 8V−3V=5V instead of 8+Vdd=10.5V), source-drain (e.g., 8V−3V−Vt=−4 v instead of 8+Vdd=10.5V, Vt=NMOS threshold voltage).

Figure 10:
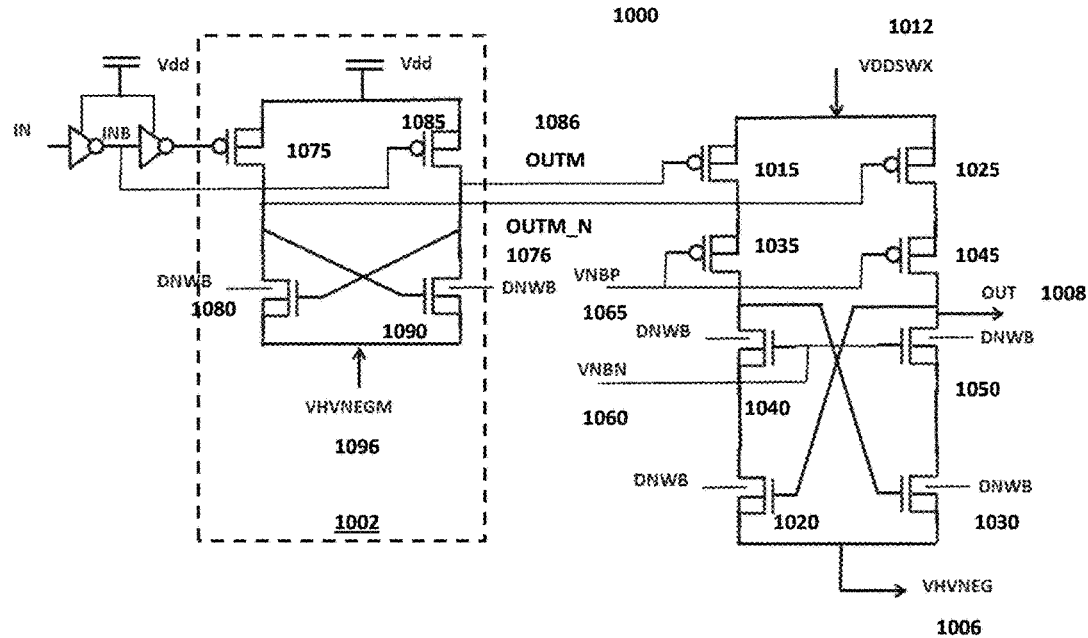
FIG. 10 depicts another negative high voltage level shifter.

Referring to FIG. 10, a third embodiment of a level shifter is depicted, negative high voltage level shifter 1000, which can be contained in logic 270, negative voltage driver circuit 230, high voltage driver circuit 225, and/or high voltage driver circuit 226 in FIG. 2. Negative high voltage level shifter 1000 comprises the same components as negative high voltage level shifter 900 with the addition an intermediate (medium) negative level shifter 1002 consists of PMOS transistors 1075 and 1085 and NMOS transistors 1080 and 1090. The introduction of the intermediate negative level shifter 1002 with an intermediate negative level VHVNEGM, e.g., −3V and additional intermediate negative bias level VNBP 1065 for gates of PMOS transistors and VNBN for gates of NMOS transistors is to reduce voltage stress across the terminals of the PMOS and NMOS transistors in the negative (high) level shifter. Negative high voltage level shifter 1000 receives an input, IN, and generates an output, OUT 1008. The output, OUT 1008, varies between VHVNEG 1006, GND and Vdd, which in this example are −8V, 0V and 2V, respectively. The output, OUT 1008, varies between VHVNEG 1006, and GND (=VDDSWX 1012), which in this example are −8V and 0V, respectively when the voltage VHVNEG 1006 is at maximum high negative voltage −8V. VHVNEGM can comprise a negative power supply of −3V. The output OUTM 1086 and OUTM_N 1076 of the intermediate negative level shifter 1002 varies between VHVNEGM and Vdd, which in this example are −3V and 2V, respectively. VDDSWX 1012 can be a switched supply that switches between 2V and 0V. VDDSWX (Vdd high supply) 1012 is initially at Vdd, e.g., 2V, and is switched to 0V when VHVNEG 1006 is at approximately half the maximum negative voltage, e.g., −4V, or at maximum negative voltage, e.g., −8V. VNBP 1065 can be switched between 0V and −3V. When the VDDSWX 1012 is at 0V, the VNBP 1065 is at −3V, the output OUTM_N 1076 is at −3V (=VHVNEGM) to pass 0V to the output OUT 1008. Since the voltage VNBP 1065 is at the intermediate negative voltage −3V, the voltage stress across gate-source/drain of the transistors 1035 and 1045 is reduced. Since the voltage VNBN 1060 is at the intermediate negative voltage −3V, the voltage stress across gate-source/drain of the transistors 1040 and 1050 is reduced and the voltage stress across source-drain of the transistors 1020 and 1030 is reduced. Since the voltage OUT 1008 is at 0V (instead of =Vdd), the voltage stress across gate-source/drain of the transistors 1020 and 1030 is reduced and the voltage stress across source-drain of the transistors 1040 and 1050 is reduced. The cascoding PMOS transistors 1035 and 1045 has its bulk (nwell) connected to its source to reduce voltage stress between the bulk and drain/source. The cascoding NMOS transistors 1040 and 1050 has its bulk (Pwell) connected to its source to reduce voltage stress between the bulk and drain/source.

Figure 11:
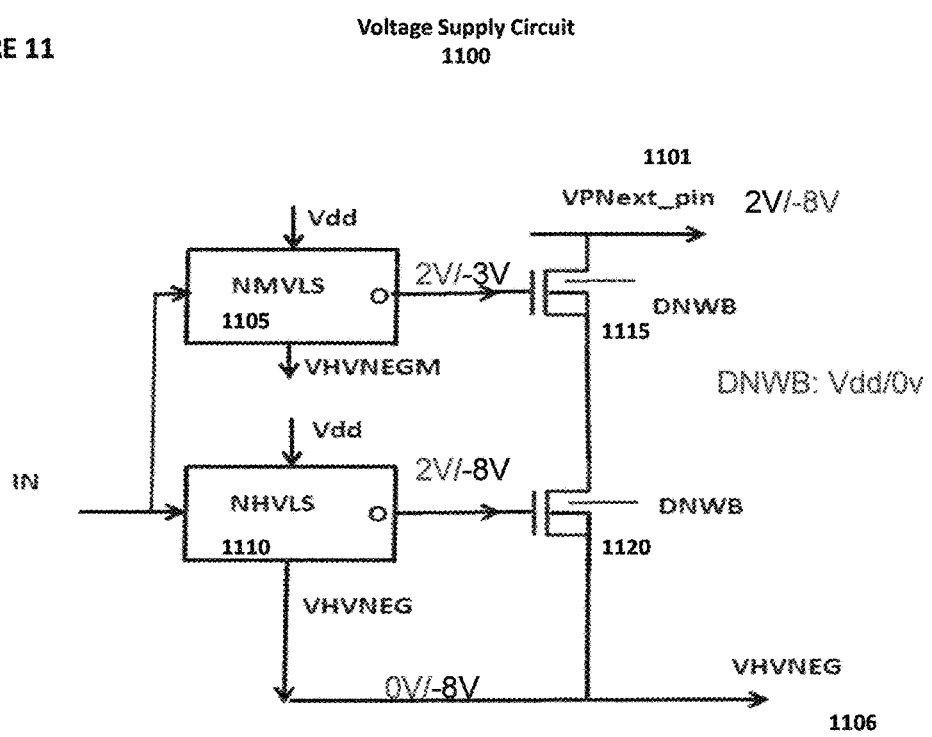
FIG. 11 depicts a voltage supply circuit.

Referring to FIG. 11, voltage supply circuit 1100 is depicted. Voltage supply circuit 1100 comprises a first negative voltage level shifter circuit 1105 and a second negative voltage level shifter circuit 1110, each of which can comprise one of negative high voltage level shifters 800, 900, and 1000. In this embodiment, first negative voltage level shifter circuit 1105 and second negative voltage level shifter circuit 1110 together comprise negative high voltage level shifter 1000 and receives an input, IN, and generates a medium (intermediate) negative voltage, VHVNEGM, which ranges between 2V and −3V in this example, and a high negative voltage, VHVNEG, which ranges between 0V and −8V in this example. First negative voltage level shifter circuit 1105 and second negative voltage level shifter circuit 1110 are coupled to NMOS transistor 1115 (cascoding transistor) and NMOS transistor 1120 as shown. DNWB receives values of Vdd or 0V, and VPNext_pin 1101 receives a voltage of 2V or −8V. When the circuit 1100 is enabled, the output of the circuit 1105 and 1110 are for example equal to 2V which enable the NMOS transistors 1115 and 1120 to pass the VPNext_pin 1101 level into the VHVNEG 1106. When the circuit 1100 is disabled, the output of the circuit 1105 and 1110 are for example equal to −3V and −8 v respectively which disable the NMOS transistors 1115 and 1120.

Figure 12:
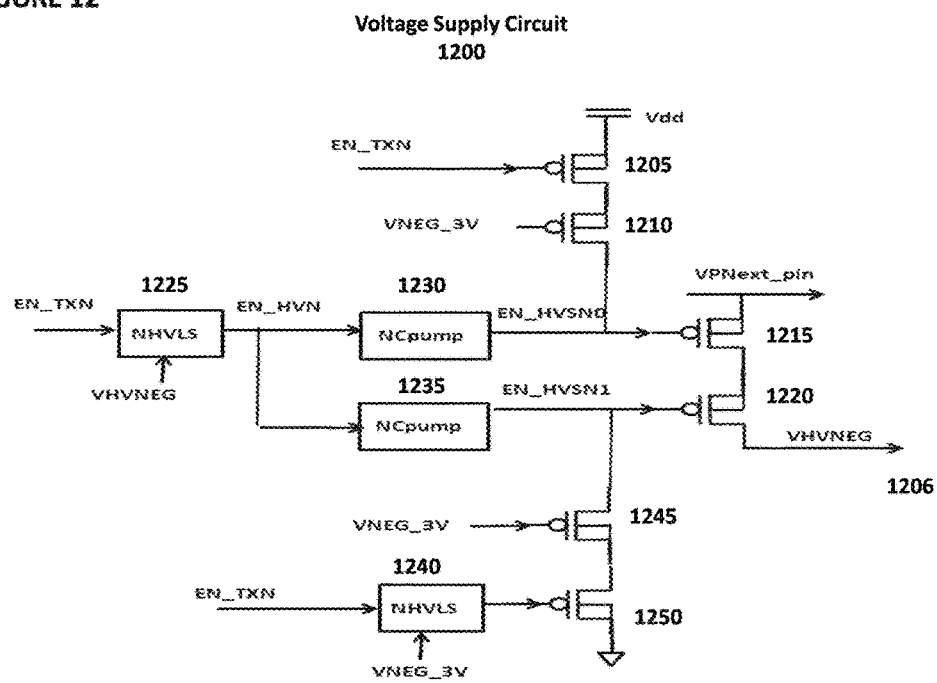
FIG. 12 depicts another voltage supply circuit.

Referring to FIG. 12, voltage supply circuit 1200 is depicted. Voltage supply circuit 1100 comprises negative voltage level shifter circuits 1225 and 1240, each of which comprises one of negative high voltage level shifters 800, 900, and 1000. Voltage supply circuit 1200 receives an enable signal, EN_TXN, which is 0V in the "off" state and 2V in the "on" state, and generates a high negative voltage, VHVNEG, which ranges between 0V and −8V in this example. VNEG_3V is 2V or −3V. Negative charge pump 1230 and 1235 each pumps an input of −8V to an output of −12V. When the circuit 1200 is enabled, the outputs of the circuits 1230 and 1235 is at for example −12V, hence enable the PMOS transistors 1215 and 1220 to pass the voltage from VPNext_pin level into the VHVNEG 1206. When the circuit 1200 is disabled, the outputs of the circuits 1230 and 1235 is at for example 2V and 0V respectively, hence disable the PMOS transistors 1215 and 1220. The PMOS transistors 1210 and 1245 serves as cascoding transistors to reduce voltage stress for the transistors 1205 and 1250 respectively.

Figure 13:
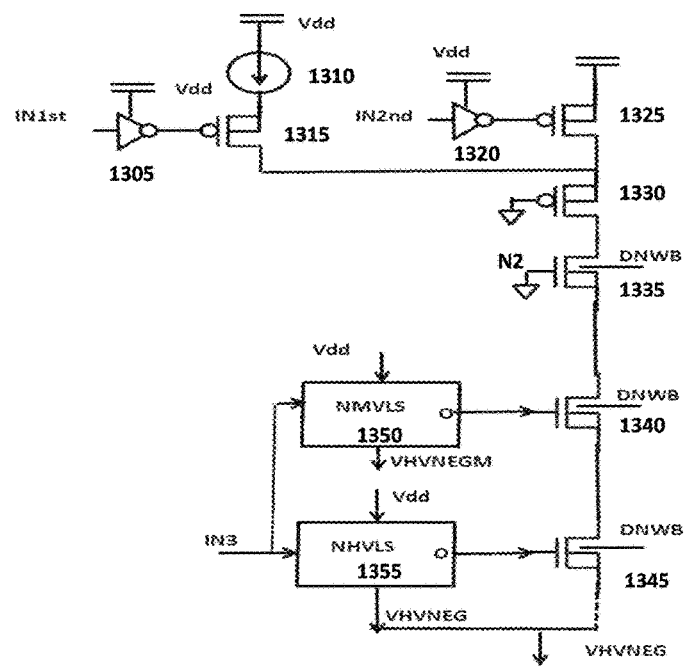
FIG. 13 depicts a negative high voltage discharge circuit.

Referring to FIG. 13, negative high voltage discharge circuit 1300 is depicted. When the inputs, IN3, IN1st and IN2nd, change state to enable, the transistors 1315 and 1325 are enabled and outputs of circuit 1350 and 1355 are for example equal to Vdd (2V), VHVNEG is discharged through N2 from −8V to around −0.7V. The gates of NMOS transistors 1340 (cascoding transistor) and 1345 equal to for example −3V and −8V in off state (the circuit 1350 and 1355 are disabled) to isolate the negative level VHVNEG from the NMOS transistor 1335. The discharge current is controlled initially by current bias 1310 (enabled by the input IN1st) and then by the transistor 1325 (enabled by the input IN2nd).

Figure 14:
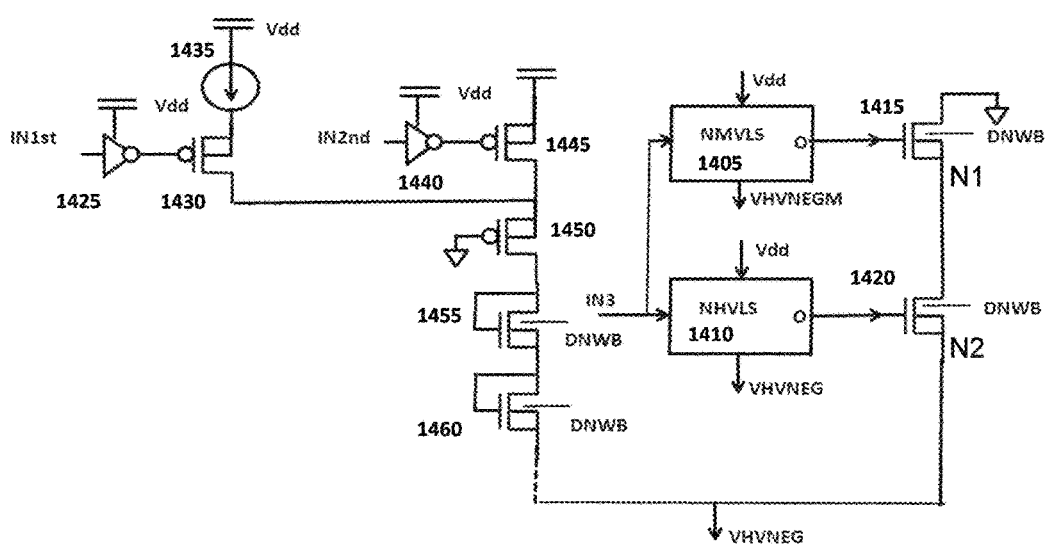
FIG. 14 depicts another negative high voltage discharge circuit.

Referring to FIG. 14, negative high voltage discharge circuit 1400 is depicted. When the inputs, IN1st and IN2nd, change state to enable, VHVNEG is discharged from −8V to an intermediate negative voltage level, determined by the number of Vt (threshold voltage) of diode connected NMOS transistors 1455 and 1460. The discharge current is controlled initially by current bias 1435 (enabled by the input IN1st) and then by the transistor 1445 (enabled by the input IN2nd). Then VHVNEG is discharged quickly from the intermediate negative level through N1 1415 and N2 1420 transistor to around 0.0V. The gates of the NMOS transistors 1415 (cascoding transistor) and 1420 are controlled by the medium negative level shifter 1405 and high negative level shifter 1410 respectively.

Figure 15:
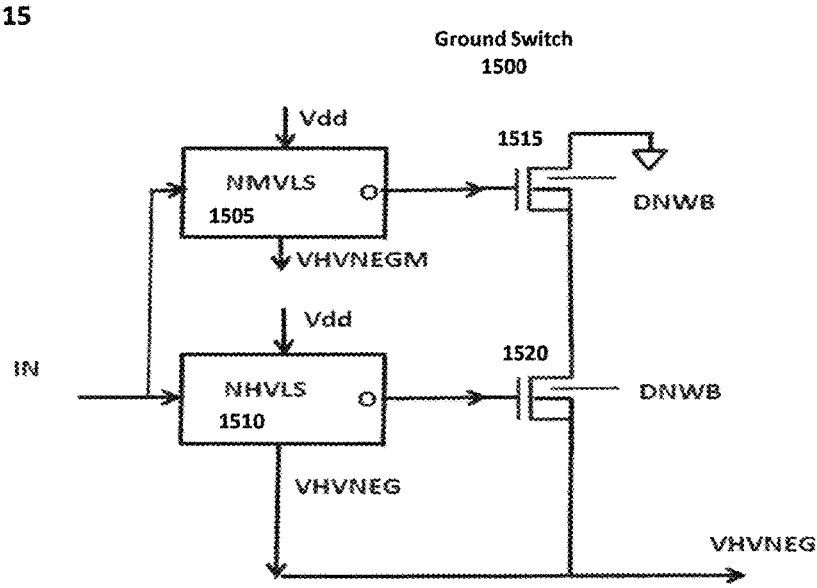
FIG. 15 depicts a ground switch.

Referring to FIG. 15, ground switch circuit 1500 is depicted. Ground switch circuit 1500 comprises negative high voltage circuit 1505, negative high voltage circuit 1510, NMOS transistor 1515, and NMOS transistor 1520. Ground switch circuit 1500 receives an input signal, IN, and generates an output signal, VHVNEG.

Figure 16:
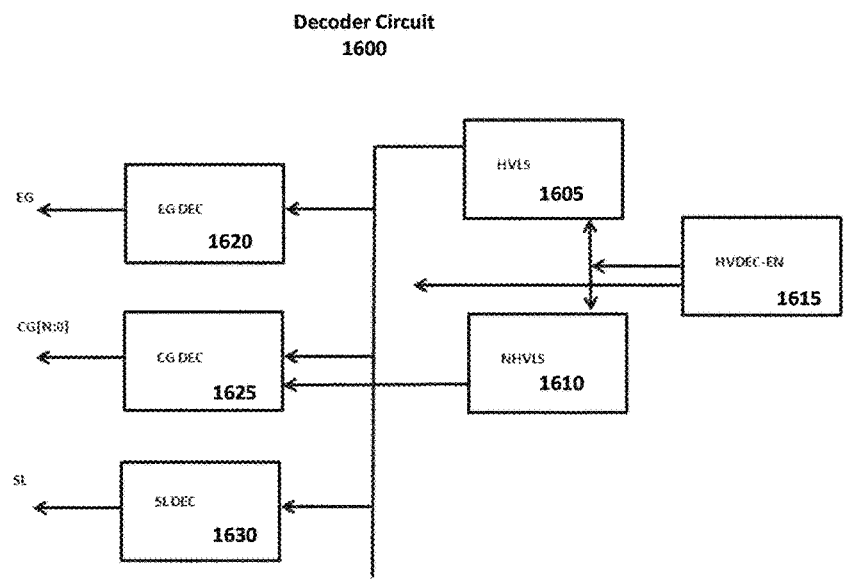
FIG. 16 depicts a decoder circuit.

Referring to FIG. 16, decoder circuit 1600 is depicted. Decoder circuit 1600 can be contained within logic 270, negative voltage driver circuit 230, high voltage driver circuit 225, and/or high voltage driver circuit 226 in FIG. 2. Decoder circuit 1600 comprises high voltage level shifter 1605, negative high voltage level shifter 1610, high voltage decider enable circuit 1615, erase gate decoder 1620, control gate decoder 1625, and source line decoder 1630. High voltage enable circuit 1615 is used to apply a high voltage from high voltage level shifter 1605 and/or a negative high voltage from negative high voltage level shifter 1610 to erase gate decoder 1620, coupling gate decoder 1625, and/or source line decoder 1630.

Figure 17:
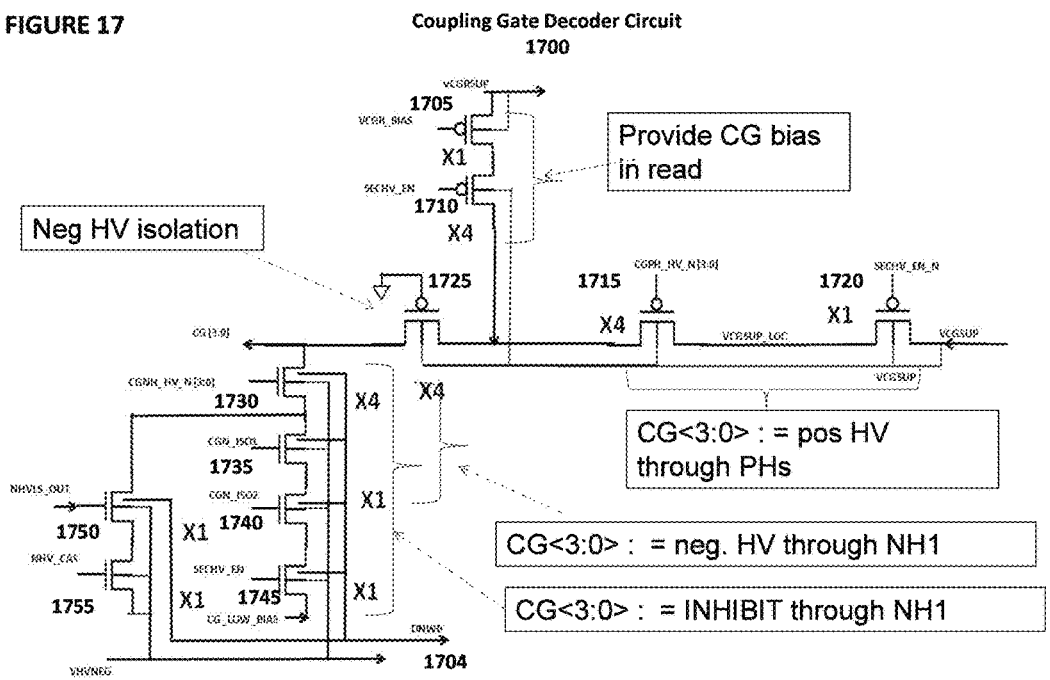
FIG. 17 depicts a coupling gate decoder circuit.
Figure 18:
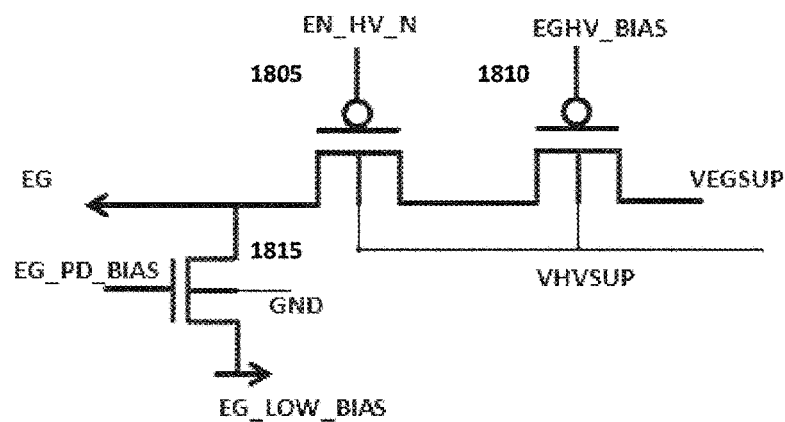
FIG. 18 depicts an erase gate decoder circuit.

Referring to FIG. 17, an embodiment 1700 is shown for control gate decoder 1625. Control gate decoder 1700 comprises PMOS transistors 1705 and 1710, which provide a bias voltage VCGSUPR for the control gate during a read operation with current controlled by the PMOS transistor 1705, PMOS transistor 1725, which provides isolation for a negative high voltage, PMOS transistors 1715 and 1720, which provide a positive high voltage in program through PMOS transistors, and NMOS transistors 1730, 1735, 1740 and 1745 which can provide an inhibit voltage in program for the control gate and NMOS transistor 1750 and 1755 which together with the NMOS transistor 1730 can provide a negative high voltage in erase for the control gate. The NMOS transistor 1755 serves as a current control for the negative voltage supply for the control gates. The NMOS transistor 1750 is enabled by a negative voltage level shifter enabled by a local decoded sector enabling line SECHV_EN in erase. As shown the circuit 1700 provides decoding for four control gate CG [3:0], one erase gate EG, and one source line SL. There are four PMOS transistors 1715 with gates enabled by four global pre-decoded CG lines CGPH_HV_N[3:0]. There are four PMOS transistors 1710 with gates enabled by a local decoded sector enabling line SECHV_EN. There are four isolation PMOS transistors 1725 with gates enabled by a ground line. There are four NMOS transistors 1730 with gates enabled by four global pre-decoded CG lines CGNH_HV_N [3:0]. The PMOS transistor 1720 is enabled by a local decoded sector enabling line SECHV_EN_N to pass positive high voltage VCGSUP into the control gates. The NMOS transistors 1735 and 1740 are enabled by a global control signal CGN_ISO1 and CGN_ISO2 respectively to pass CG_LOW_BIAS (such as the inhibit voltage in program) or to serve as isolation voltage, e.g., −8V and −3V respectively. The NMOS transistor 1745 is enabled by a local decoded sector enabling line SECHV_EN to pass CG_LOW_BIAS level into the control gate. DNWB 1704 is controlled to be 0V when VHVNEG is at a negative voltage, e.g., −8V. As shown there is no cascoding transistor needed in the positive CG decoding function in the CG decoder 1700. Alternatively for negative CG decoding, the cascoding NMOS transistor 1740 is optional. Alternatively the current controlled NMOS transistor for negative CG decoding 1755 is optional Referring to FIG. 18, an embodiment 1800 is shown for erase gate decoder 1620. Erase gate decoder 1800 comprises PMOS transistors 1805 and 1810 and NMOS transistor 1815. The PMOS transistor 1810 is a current controlled to pass a voltage or a high voltage VEGSUP into the erase gate. The PMOS transistor 1805 is enabled by a local decoded sector enabling line EN_HV_N to pass voltage VEGSUP level into the erase gate. The NMOS transistor 1815 is used to pass voltage EG_LOW_BIAS level, e.g, 0V-2.6V, into the erase gate. The decoded erase gate is shared across multiple rows of memory cells. As shown there is no cascoding transistor needed in the EG decoder 1620. Alternatively cascoding transistor PMOS and NMOS can be implemented for the EG decoder 1629.

Figure 19:
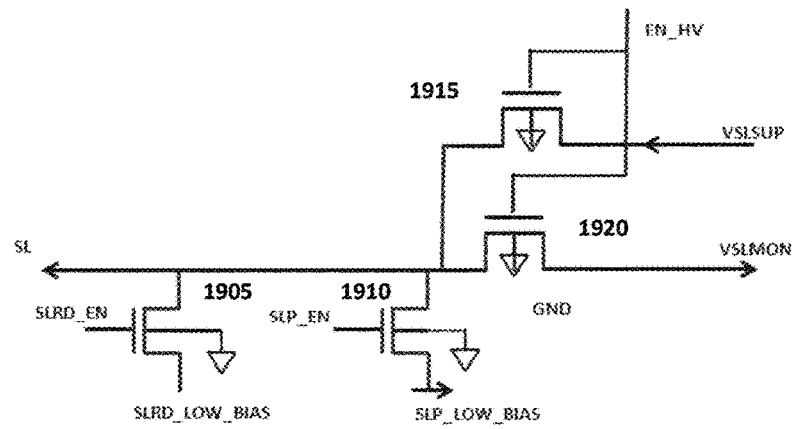
FIG. 19 depicts a source line decoder circuit.

Referring to FIG. 19, an embodiment 1900 is shown for source line decoder 1630. Source line decoder 1900 comprises NMOS transistors 1905, 1910, 1915, and 1920. Source line decoder 1900 provides a bias voltage, SLP_LOW_BIAS, at a value of around 0.5V for the source line for an unselected cell. Applying this bias voltage prevents leakage for unselected memory cells. The NMOS transistor 1915 is used to pass VSLSUP level into the sourceline in program. The decoded sourceline is shared across multiple rows of memory cells, The NMOS transistor 1920 is used to monitor VSLMON level from the sourceline in program. The NMOS transistor 1905 is used to pass SLRD_LOW_BIAS, e.g., 0V, level into the sourceline in read.

Figure 20:
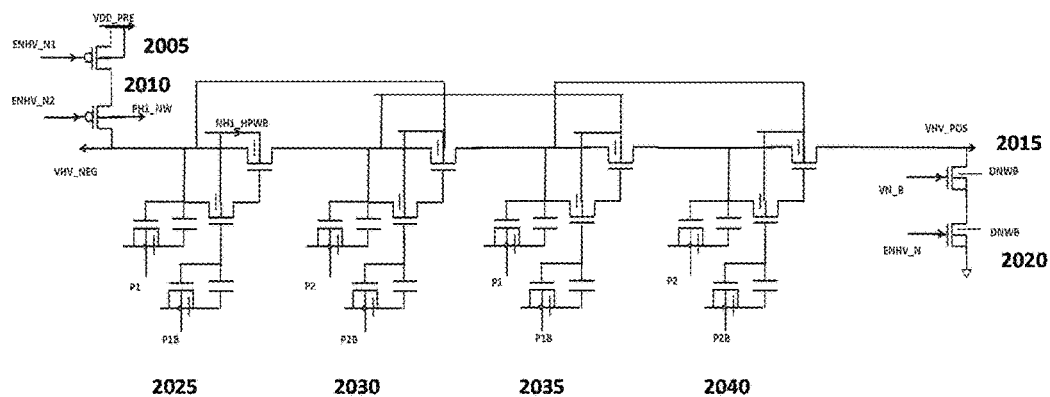
FIG. 20 depicts a charge pump.

Referring to FIG. 20, high voltage negative chargepump circuit 2000 is depicted. High voltage negative chargepump circuit 2000 comprises PMOS transistor 2005 and PMOS transistor 2010 coupled to negative pumped output, NMOS transistor 2015 and NMOS transistor 2020 coupled to positive pumped output, and pump stage circuits 2025, 2030, 2035, and 2040. High voltage negative chargepump circuit 2000 provides a high negative voltage, VHV_NEG, and a high positive voltage, VHV_POS, which each of the pump stage circuits 2025, 2030, 2035, and 2045 receiving a voltage and outputting a higher positive voltage or a high negative voltage. The bulk (pwell) of the pass NMOS transistor of each stage is coupled to the output of the previous stage as shown. The DNWB of the NMOS transistors are biased at 0V in negative voltage pumping, at HV in positive voltage pumping, and optionally at Vdd at other times.

Figure 22A:
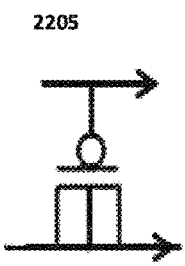
FIGS. 22A, 22B, and 22C depict capacitors.
Figure 22B:
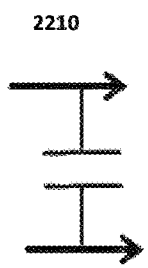
Figure 22C:
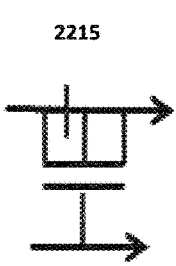

Referring to FIGS. 22A, 22B, and 22C, examples of capacitors that can be used in chargepump circuit 2000 are depicted, including the use of PMOS transistor 2205, capacitor 2210, and NMOS transistor 2215.

Figure 21:
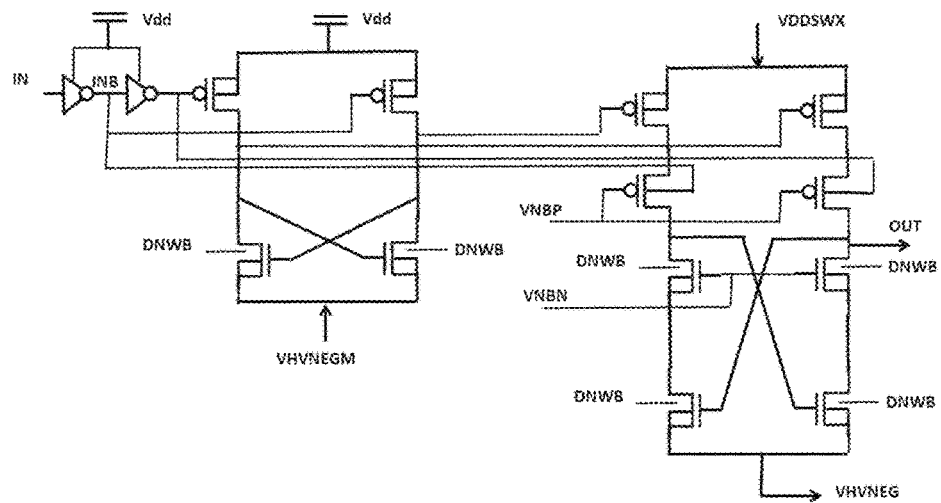
FIG. 21 depicts a negative high voltage level shifter.

Referring to FIG. 21, negative high voltage level shifter 2100 is depicted. The components of negative high voltage level shifter 2100 are identical to those of negative high voltage level shifter 1000 shown in FIG. 10, the difference being that the HV nwell (bulk of PMOS transistor) is driven by input inverters in FIG. 21 is at 0V when the particular transistor is off, to minimize junction breakdown in the transistor.

Referring to FIG. 23, negative high voltage level shifter 2300 is depicted. Negative high voltage level shifter 2300 receives an input, IN, and generates an output, OUT. OUT is −8V or 2V in this example. DNWB is driven by Vdd or 0V. In this circuit there are two PMOS in series but only single NMOS in each leg of the level shifter.

Figure 24:
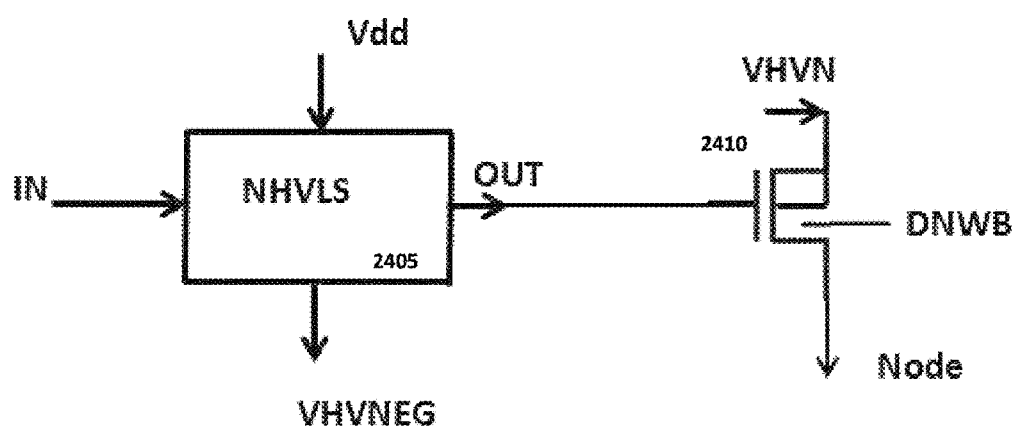
FIG. 24 depicts a multiplexor.
Figure 25:
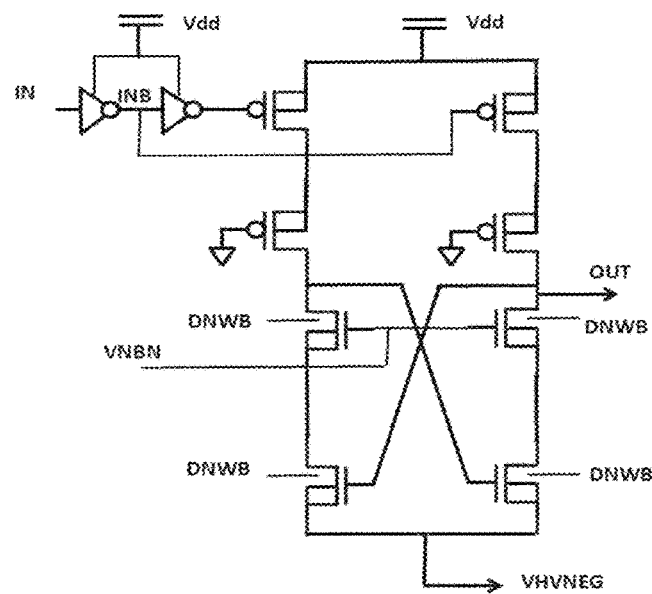
FIG. 25 depicts another negative high voltage level shifter.

Referring to FIG. 24, multiplexing circuit 2400 is depicted with only NMOS pass gate Referring to FIG. 25, negative high voltage level shifter 2500 is depicted. The components of negative high voltage level shifter 2100 are identical to those of negative high voltage level shifter 900 shown in FIG. 9, the difference being the PMOS and NMOS transistors for cascoding purpose have its own separate bulk.

The benefits of applying a negative voltage to the word line 22 or coupling gate 26 of the unselected or selected memory cells 10 during the operations of read, erase and program are to allow the memory cell to be scaled down more effectively. During erase, negative voltage on wordline of selected memory cells allows overall erase voltage to be lowered thus allowing cell dimension to be smaller (sustaining less voltage across various inter-cell or inter-layer dimensional horizontal or vertical spacing, isolation, width, length, etc. . . . ). During program, negative voltage on wordline of unselected memory cells reduces leakage for un-selected memory cells leading to less disturb (for un-selected cells in same sector), more accurate programming current (for selected cells, less leakage interference) and less power consumption. For read, negative voltage on wordline of unselected memory cells leads to more accurate sensing due to less interference from leakage. It is also advantageous to combine negative wordline, negative coupling gate and negative P substrate for use in memory array operation resulting in lowered erase/program voltages and current, more effective erasing and programming, less cell disturb, and less cell leakage.

What is claimed is:

1. A negative high voltage level shifter for receiving an input and generating an output, comprising:
   a cascode circuit comprising a first PMOS transistor, a second PMOS transistor, a first NMOS transistor and a second NMOS transistor, the first NMOS transistor comprising a deep N-well and the second NMOS transistor comprising a deep N-well;
   wherein a terminal of the first NMOS transistor is coupled to a terminal of the second NMOS transistor and generates a high negative voltage as the output when the input is low.

2. The negative high voltage level shifter of claim 1, wherein the deep N-well is driven to zero voltage when the output generates a high negative voltage.

3. The negative high voltage level shifter of claim 1, further comprising a negative medium voltage level shifter circuit.

4. The negative high voltage level shifter of claim 1, wherein a Vdd high voltage supply switches to ground when an output of the negative high voltage level shifter generates a negative voltage.

5. A negative high voltage level shifter for receiving an input and generating an output, comprising:
 a first inverter for receiving the input and generating a first inverter output;
 a second inverter for receiving the first inverter output and generating a second inverter output;
 a first PMOS transistor comprising a first terminal coupled to a positive voltage supply, a second terminal, and a gate coupled to the second inverter output;
 a second PMOS transistor comprising a first terminal coupled to the second terminal of the first PMOS transistor, a second terminal, and a gate coupled to ground;
 a first NMOS transistor comprising a first terminal coupled to the second terminal of the second PMOS transistor, a gate, a second terminal, and a deep N-well;
 a second NMOS transistor comprising a first terminal coupled to the second terminal of the first NMOS transistor, a gate, a second terminal coupled to a negative voltage supply, and a deep N-well;
 a third PMOS transistor comprising a first terminal coupled to the positive voltage supply, a second terminal, and a gate coupled to the first inverter output;
 a fourth PMOS transistor comprising a first terminal coupled to the second terminal of the third PMOS transistor, a second terminal providing the output, and a gate coupled to ground;
 a third NMOS transistor comprising a first terminal coupled to the second terminal of the fourth PMOS transistor, a gate, a second terminal, and a deep N-well;
 a fourth NMOS transistor comprising a first terminal coupled to the second terminal of the third NMOS transistor, a gate, a second terminal coupled to a negative voltage supply, and a deep N-well;
 wherein the gate of the first NMOS transistor and the gate of the third NMOS transistor are coupled to a control signal, the gate of the second NMOS transistor is coupled to the second terminal of the fourth PMOS transistor, and the gate of the fourth NMOS transistor is coupled to the second terminal of the second PMOS transistor;
 wherein when the input is zero volts, the output is a negative voltage generated by the negative voltage supply.

6. The negative high voltage level shifter of claim 5, wherein a bulk of the first PMOS transistor, a bulk of the second PMOS transistor, a bulk of the third PMOS transistor, and a bulk of the fourth PMOS transistor are coupled to the positive voltage supply.

7. A negative high voltage level shifter for receiving an input and generating an output, comprising:
 a first inverter for receiving the input and generating a first inverter output;
 a second inverter for receiving the first inverter output and generating a second inverter output;
 a first PMOS transistor comprising a first terminal coupled to a positive voltage supply, a second terminal, and a gate coupled to the second inverter output;
 a first NMOS transistor comprising a first terminal coupled to the second terminal of the first PMOS transistor, a gate, a second terminal coupled to a negative voltage supply, and a deep N-well;
 a second PMOS transistor comprising a first terminal coupled to the positive voltage supply, a second terminal, and a gate coupled to the first inverter output; and
 a second NMOS transistor comprising a first terminal coupled to the second terminal of the second PMOS transistor, a gate, a second terminal coupled to the negative voltage supply, and a deep N-well;
 wherein the gate of the first NMOS transistor is coupled to the second terminal of the second PMOS transistor, and the gate of the second NMOS transistor is coupled to the second terminal of the first PMOS transistor;
 wherein when the input is zero volts, the output is a negative voltage generated by the negative voltage supply.

8. The negative high voltage level shifter of claim 7, wherein a bulk of the first PMOS transistor is coupled to the first terminal of the first PMOS transistor and a bulk of the second PMOS transistor is coupled to the first terminal of the second PMOS transistor.

9. A negative high voltage level shifter for receiving an input and generating an output, comprising:
 a first inverter for receiving the input and generating a first inverter output;
 a second inverter for receiving the first inverter output and generating a second inverter output;
 a first voltage level shifter for receiving the first inverter output and the second inverter output and generating an intermediate stage output, wherein when the input is zero volts, the intermediate stage output is a first negative voltage; and
 a second voltage level shifter for receiving the intermediate stage output and the first inverter output and generating the output, wherein when the intermediate stage output is a first negative voltage, the output is a second negative voltage of a larger magnitude than the first negative voltage.

10. The negative high voltage level shifter of claim 9, wherein the first voltage level shifter comprises:
 a first PMOS transistor comprising a first terminal coupled to a first positive voltage supply, a second terminal, and a gate coupled to the second inverter output;
 a first NMOS transistor comprising a first terminal coupled to the second terminal of the first PMOS transistor, a gate, a second terminal coupled to a first negative voltage supply for generating the first negative voltage, and a deep N-well;
 a second PMOS transistor comprising a first terminal coupled to the first positive voltage supply, a second terminal for providing the intermediate stage output, and a gate coupled to the first inverter output; and
 a second NMOS transistor comprising a first terminal coupled to the second terminal of the second PMOS transistor, a gate, a second terminal coupled to the first negative voltage supply, and a deep N-well;
 wherein the gate of the first NMOS transistor is coupled to the second terminal of the second PMOS transistor and the gate of the second NMOS transistor is coupled to the second terminal of the first PMOS transistor.

11. The negative high voltage level shifter of claim 10, wherein the second voltage level shifter comprises:
- a third PMOS transistor comprising a first terminal coupled to a second positive voltage supply, a second terminal, and a gate coupled to the intermediate stage output;
- a fourth PMOS transistor comprising a first terminal coupled to the second terminal of the third PMOS transistor, a second terminal, and a gate coupled to a first control signal;
- a third NMOS transistor comprising a first terminal coupled to the second terminal of the fourth PMOS transistor, a gate coupled to a second control signal, a second terminal, and a deep N-well;
- a fourth NMOS transistor comprising a first terminal coupled to the second terminal of the third NMOS transistor, a gate, a second terminal coupled to a second negative voltage supply, and a deep N-well;
- a fifth PMOS transistor comprising a first terminal coupled to the second positive voltage supply, a second terminal, and a gate coupled to the first inverter output;
- a sixth PMOS transistor comprising a first terminal coupled to the second terminal of the fifth PMOS transistor, a second terminal providing the output, and a gate coupled to the first control signal;
- a fifth NMOS transistor comprising a first terminal coupled to the second terminal of the sixth PMOS transistor, a gate, a second terminal, and a deep N-well; and
- a sixth NMOS transistor comprising a first terminal coupled to the second terminal of the fifth NMOS transistor, a gate, a second terminal coupled to the second negative voltage supply, and a deep N-well;
- wherein the gate of the fourth NMOS transistor is coupled to the second terminal of the sixth PMOS transistor, and the gate of the sixth NMOS transistor is coupled to the second terminal of the fourth PMOS transistor.

12. The negative high voltage level shifter of claim 11, wherein a bulk of the fourth PMOS transistor is coupled to the first terminal of the fourth PMOS transistor and a bulk of the sixth PMOS transistor is coupled to the first terminal of the sixth PMOS transistor.

13. The negative high voltage level shifter of claim 11, wherein a bulk of the fourth PMOS transistor is coupled to the first inverter output and a bulk of the sixth PMOS transistor is coupled to the second inverter output.

14. The negative high voltage level shifter of claim 11, wherein a bulk of the third PMOS transistor and a bulk of the fifth PMOS transistor are coupled to the second positive voltage supply.

15. The negative high voltage level shifter of claim 12, wherein a bulk of the third PMOS transistor and a bulk of the fifth PMOS transistor are coupled to the second positive voltage supply.

16. The negative high voltage level shifter of claim 13, wherein a bulk of the third PMOS transistor and a bulk of the fifth PMOS transistor are coupled to the second positive voltage supply.

* * * * *